US012701986B2

(12) United States Patent
Hong et al.

(10) Patent No.: US 12,701,986 B2
(45) Date of Patent: Aug. 4, 2026

(54) WET RECESS FOR RU SUBTRACTIVE PROCESS

(71) Applicant: SAMSUNG ELECTRONICS CO., LTD., Suwon-si (KR)

(72) Inventors: Wonhyuk Hong, Clifton Park, NY (US); Jaemyung Choi, Niskayuna, NY (US); Jaejik Baek, Watervliet, NY (US); Janggeun Lee, Delmar, NY (US); Myunghoon Jung, Clifton Park, NY (US); Taesun Kim, Ballston Spa, NY (US); Kang-ill Seo, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 533 days.

(21) Appl. No.: 17/969,440

(22) Filed: Oct. 19, 2022

(65) Prior Publication Data

US 2023/0361032 A1     Nov. 9, 2023

Related U.S. Application Data

(60) Provisional application No. 63/337,774, filed on May 3, 2022.

(51) Int. Cl.
*H10W 20/41*          (2026.01)
*H10W 20/00*          (2026.01)
(Continued)

(52) U.S. Cl.
CPC ....... *H10W 20/435* (2026.01); *H10W 20/054* (2026.01); *H10W 20/063* (2026.01);
(Continued)

(58) Field of Classification Search
CPC ........... H01L 23/5283; H01L 21/76865; H01L 21/76885; H01L 21/28568; H01L 23/5226;
(Continued)

(56) References Cited

U.S. PATENT DOCUMENTS 8,809,183 B2    8/2014  Bonilla et al.
9,093,503 B1    7/2015  Chen et al.
(Continued)

FOREIGN PATENT DOCUMENTS

CN        106469675 A        3/2017
CN        112514049 A        3/2021

OTHER PUBLICATIONS

Joern-Holger Franke et al., "EPE analysis of sub-N10 BEoL flow with and without fully self-aligned via using Coventor SEMulator3D", Proceedings SPIE vol. 10145, Metrology, Inspection, and Process Control for Microlithography XXXI, Mar. 28, 2017, p. 1014529 (10 pages), DOI: 10.1117/12.2258195, XP060087842.
(Continued)

*Primary Examiner* — Karen Kusumakar
(74) *Attorney, Agent, or Firm* — Myers Bigel, P.A.

(57) ABSTRACT

A semiconductor device includes a dielectric layer, a plurality of vias formed in the dielectric layer, an adhesion layer deposited on a top surface of the dielectric layer, and a plurality of metal lines. A first metal line of the plurality of metal lines includes a first recess formed at a bottom surface of the first metal line such that a first section of the first metal line directly contacts the first via and a second section of the first metal line defined by the first recess does not directly contact the first via or the dielectric layer in which the first via is formed.

17 Claims, 16 Drawing Sheets

(51) Int. Cl.

| | |
|---|---|
| *H10P 14/40* | (2026.01) |
| *H10W 20/42* | (2026.01) |
| *H10W 20/44* | (2026.01) |

(52) U.S. Cl.
CPC ........... *H10P 14/418* (2026.01); *H10W 20/42* (2026.01); *H10W 20/425* (2026.01); *H10W 20/4403* (2026.01)

(58) Field of Classification Search
CPC ......... H01L 23/53209; H01L 23/53223; H01L 23/53238; H01L 23/53266; H01L 21/76814; H01L 21/76834; H01L 21/76841; H01L 21/76897; H01L 23/53252; H01L 21/76868; H01L 23/53257
See application file for complete search history.

(56) References Cited

U.S. PATENT DOCUMENTS

| | | | |
|---|---|---|---|
| 9,852,980 | B2 | 12/2017 | Bonilla et al. |
| 9,917,009 | B2 | 3/2018 | Kamineni et al. |
| 9,953,865 | B1 * | 4/2018 | Briggs .............. H01L 21/76849 |
| 10,290,536 | B2 | 5/2019 | Lu et al. |
| 2015/0214093 | A1 | 7/2015 | Dordi et al. |
| 2015/0380302 | A1 | 12/2015 | Mountsier et al. |
| 2019/0019726 | A1 * | 1/2019 | Ryan ................. H01L 21/76877 |
| 2019/0363048 | A1 * | 11/2019 | Zhao ..................... H10W 20/42 |
| 2020/0357683 | A1 | 11/2020 | Liu |
| 2021/0407908 | A1 | 12/2021 | Huang |
| 2022/0020688 | A1 | 1/2022 | Xie et al. |
| 2022/0068826 | A1 | 3/2022 | Kuo et al. |

OTHER PUBLICATIONS

The Extended European Search Report issued on Sep. 22, 2023 by the European Patent Office for European Patent Application No. 23164755.3.

* cited by examiner

402 — Perform contact metallization on a base structure.

404 — Deposit SAM material on a plurality of vias.

406 — Deposit adhesion layer.

408 — Remove SAM material.

410 — Deposit metal on base structure over adhesion layer and plurality of vias.

412 — Pattern metal into plurality of metal lines.

414 — Remove portions of adhesion layer.

416 — Deposit dielectric material.

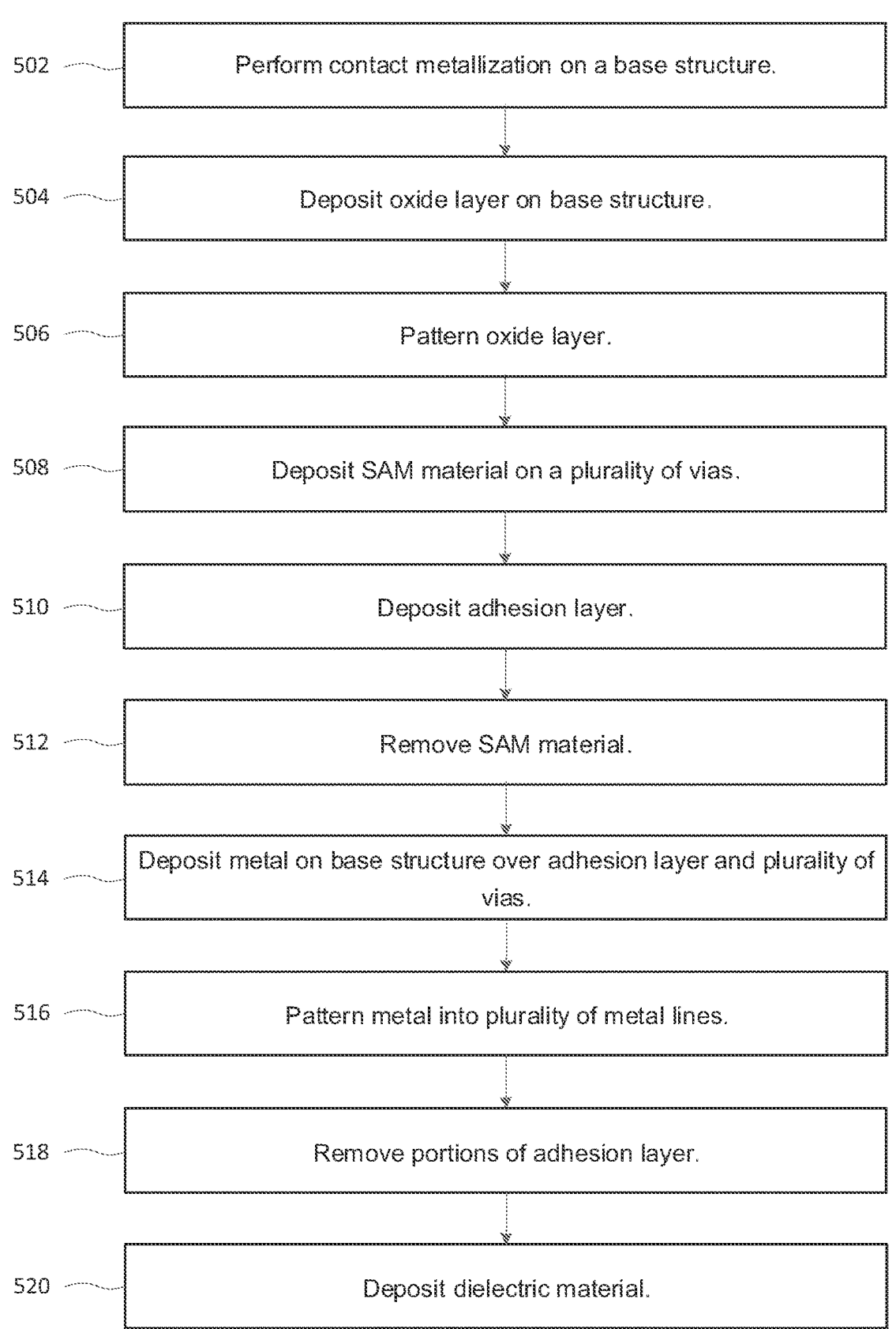

502 — Perform contact metallization on a base structure.

504 — Deposit oxide layer on base structure.

506 — Pattern oxide layer.

508 — Deposit SAM material on a plurality of vias.

510 — Deposit adhesion layer.

512 — Remove SAM material.

514 — Deposit metal on base structure over adhesion layer and plurality of vias.

516 — Pattern metal into plurality of metal lines.

518 — Remove portions of adhesion layer.

520 — Deposit dielectric material.

FIG. 5D

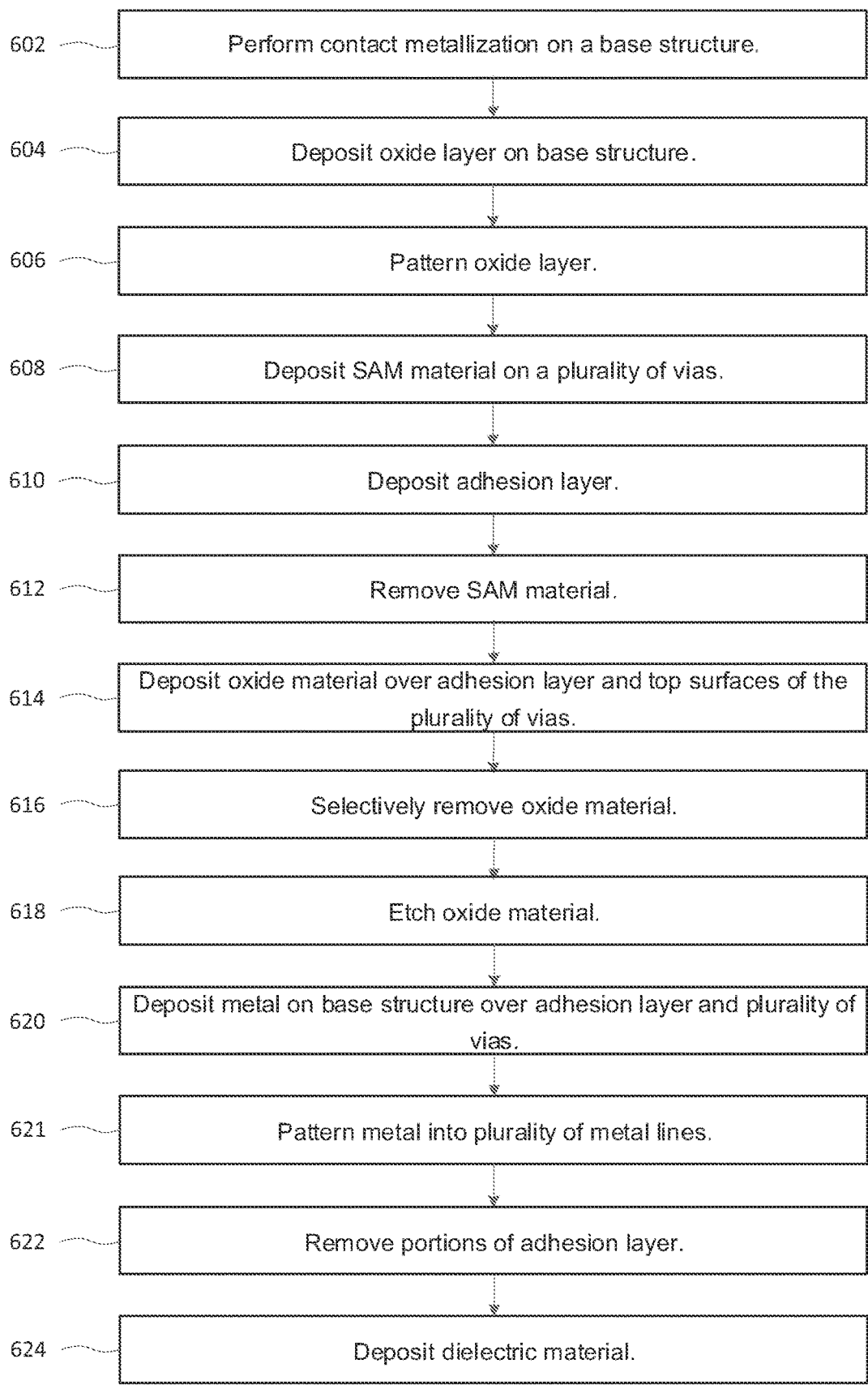

602 — Perform contact metallization on a base structure.

604 — Deposit oxide layer on base structure.

606 — Pattern oxide layer.

608 — Deposit SAM material on a plurality of vias.

610 — Deposit adhesion layer.

612 — Remove SAM material.

614 — Deposit oxide material over adhesion layer and top surfaces of the plurality of vias.

616 — Selectively remove oxide material.

618 — Etch oxide material.

620 — Deposit metal on base structure over adhesion layer and plurality of vias.

621 — Pattern metal into plurality of metal lines.

622 — Remove portions of adhesion layer.

624 — Deposit dielectric material.

FIG. 6E

WET RECESS FOR RU SUBTRACTIVE PROCESS

CROSS-REFERENCE TO RELATED APPLICATION(S)

This application is based on and claims priority under 35 U.S.C. § 119 to U.S. Provisional Application No. 63/337,774, filed on May 3, 2022 in the United States Patent and Trademark Office, the disclosure of which is incorporated herein by reference in its entirety.

BACKGROUND

1. Field

Apparatuses and methods consistent with example embodiments of the disclosure relate to a back-end-of-line (BEOL) semiconductor structure and a process for forming the BEOL semiconductor structure.

2. Description of Related Art

FIG. 1A illustrates a cross-sectional view along an x-axis of a back-end-of-line (BEOL) structure 100. FIG. 1B illustrates a cross-sectional view along a y-axis of the BEOL structure 100 of FIG. 1A.

The BEOL structure 100 may be a part of or connected to an integrated circuit such as a logic circuit, a memory flip-flop or a latch circuit formed of at least one semiconductor device to receive and output signals for the integrated circuit.

Hereinafter, the "via" may refer to a via structure or a via plug which is formed or filled in a via hole to connect two or more metal lines formed at vertically different stacks or layers. Also, the "metal line" or "metal" may refer to a metal pattern or a metal structure which may be connected to a circuit element such as a middle-of-line (MOL) element or a front-end-of-line (FEOL) element in a semiconductor device. For example, the metal line may be a power line connected to a voltage source (Vdd or Vss) to receive a positive voltage or a negative voltage supplied to a semiconductor device connected to the BEOL structure 100. As another example, the metal line itself may be an MOL element such as a gate contact structure connected to a gate electrode of a transistor or a source/drain contact structure connected to a source/drain region of the transistor included in the semiconductor device. Thus, the BEOL structure 100 may be actually a combination of a BEOL structure and an MOL structure.

The metal lines and vias may be formed of the same or different metals or metal compounds including at least one of copper (Cu), titanium (Ti), tantalum (Ta), aluminum (Al), tungsten (W), cobalt (Co), molybdenum (Mo), ruthenium (Ru), etc.

The BEOL structure 100 may include a base layer 102, which may be an etch stop layer, a first dielectric layer 104, a plurality of vias V11 formed in the first dielectric layer 104, an adhesion layer 106, a plurality of metal lines M11 and a dielectric material D11 between the plurality of metal lines M11. The plurality of metal lines M11 may extend to a top surface of the adhesion layer 106, and the dielectric material D11 may extend to a top surface of the first dielectric layer 104 and/or a top surface of one of the plurality of vias V11. The BEOL structure 100 may further include an etch stop layer 108 and a bonding layer 110 on the top surfaces of the dielectric material D11 and the plurality of metal lines M11. A second dielectric layer 112 of dielectric material D12 may be provided on a top surface of the layer 110, and a second metal material M12 may be provided on a top surface of the second dielectric layer 112, and may contact a metal line of the plurality of metal lines M11 by the via V12 formed in the second dielectric layer 112.

FIG. 2 illustrates a magnified cross-sectional view a BEOL structure 200. According to BEOL pitch scaling, as the metal width is reduced, the resistivity of the metal line increases. Thus, in order to decrease line resistance, the BEOL structure 100 may be formed based on an Ru subtractive etching process instead of a Cu damascene process. That is, the plurality of metal lines M11 may be of Ru material. However, decreasing the pitch of the metal lines decreases the space between them, and further amplifies the impact of any misalignment between the metal lines and the vias. Thus, the risk of shorting between a metal and a metal, as well as between a metal and a via increases, particularly when there is an overlay misalignment. As shown in FIG. 2, the non-contacting metal line M11 and the adhesion layer 106 depicted on the left of the magnified view are distanced from the via V11 by a distance of L1. Since the distance L1 is relatively small, the risk of metal to via leakage may be increased. Further, the misalignment may cause the contacting metal line to be partially offset from the underlying via and the resistance of the via V11 may also increase.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides back-end-of-line (BEOL) semiconductor structure and a method of fabricating the same.

According to an aspect of an example embodiment, a semiconductor device may include a dielectric layer, a plurality of vias formed in the dielectric layer, an adhesion layer deposited on a top surface of the dielectric layer, and a plurality of metal lines. A first metal line of the plurality of metal lines may include a first recess formed at a bottom surface of the first metal line such that a first section of the first metal line directly contacts the first via and a second section of the first metal line defined by the first recess does not directly contact the first via or the dielectric layer in which the first via is formed.

According to an aspect of an example embodiment, a semiconductor device may include a dielectric layer, a plurality of vias formed in the dielectric layer, a plurality of metal lines, at least one oxide pattern positioned between a bottom surface of a first metal line of the plurality of metal lines and a top surface of the dielectric layer, and at least one first recess positioned between the bottom surface of the first metal line and the dielectric layer. A second metal line of the plurality of metal lines may include a second recess formed at the bottom surface of the second metal line such that a first section of the second metal line directly contacts the first via and a second section of the second metal line defined by the second recess does not directly contact the first via or the dielectric layer in which the first via is formed.

According to an aspect of an example embodiment, a method of fabricating a semiconductor device may include providing a base structure including a dielectric layer and a plurality of vias formed in the dielectric layer, depositing an adhesion layer on a top surface of the dielectric layer, patterning a plurality of metal lines on the base structure, and forming at least one first recess at a bottom surface of a first metal line of the plurality of metal lines such that a first section of the first metal line directly contacts a first via of the plurality of vias and a second section of the first metal line defined by the at least one first recess does not directly contact the first via or the dielectric layer in which the first via is formed.

Additional aspects will be set forth in part in the description that follows and, in part, will be apparent from the description, or may be learned by practice of the presented embodiments of the disclosure.

BRIEF DESCRIPTION OF THE DRAWINGS

Example embodiments of the disclosure will be more clearly understood from the following detailed description taken in conjunction with the accompanying drawings in which:

FIG. 1A illustrates a cross-sectional view along an x-axis of a back-end-of-line (BEOL) structure;

FIG. 1B illustrates a cross-sectional view along an y-axis of the BEOL structure of FIG. 1A;

FIG. 5D is a flowchart of a process for forming a BEOL structure of FIGS. 5A-5C, according to an embodiment;

FIG. 6E is a flowchart of a process for forming a BEOL structure of FIGS. 6A-6D, according to an embodiment.

DETAILED DESCRIPTION

Figure 2:
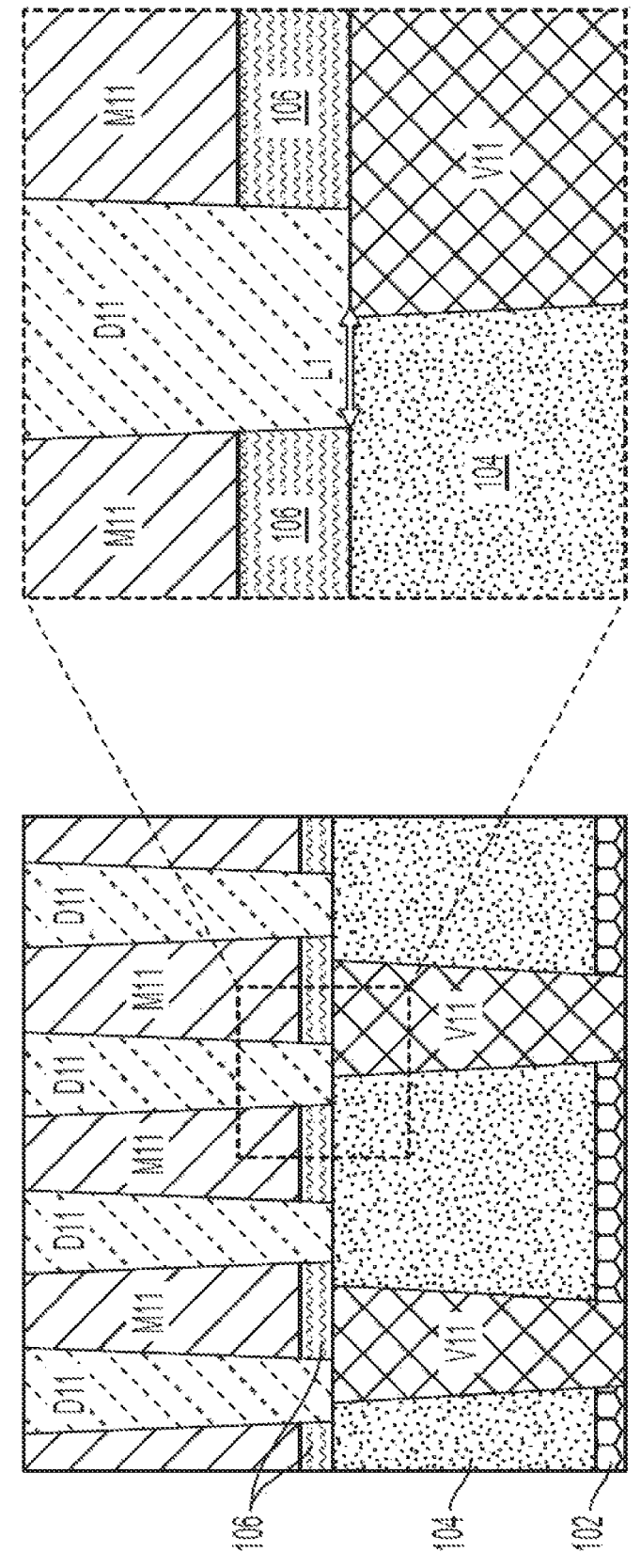
FIG. 2 illustrates a magnified cross-sectional view a BEOL structure.

The following detailed description of example embodiments refers to the accompanying drawings. The same reference numbers in different drawings may identify the same or similar elements.

The embodiments of the disclosure described herein are example embodiments, and thus, the disclosure is not limited thereto, and may be realized in various other forms. Each of the embodiments provided in the following descriptions is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a material or materials forming a metal line or a via may not be limited to metals of which examples are taken herein as long as the disclosure can be applied thereto. Further, the use of the via structure or the via scheme described herein may not be limited to a back-end-of-line (BEOL) or middle-of-line (MOL) of a semiconductor device, and instead, may be applied to a different structure or device.

It will be understood that when an element, component, layer, pattern, structure, region, or so on (hereinafter collectively "element") of a semiconductor device is referred to as being "over," "above," "on," "below," "under," "beneath," "connected to" or "coupled to" another element in the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there may be no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

Figures 1A, 1B:
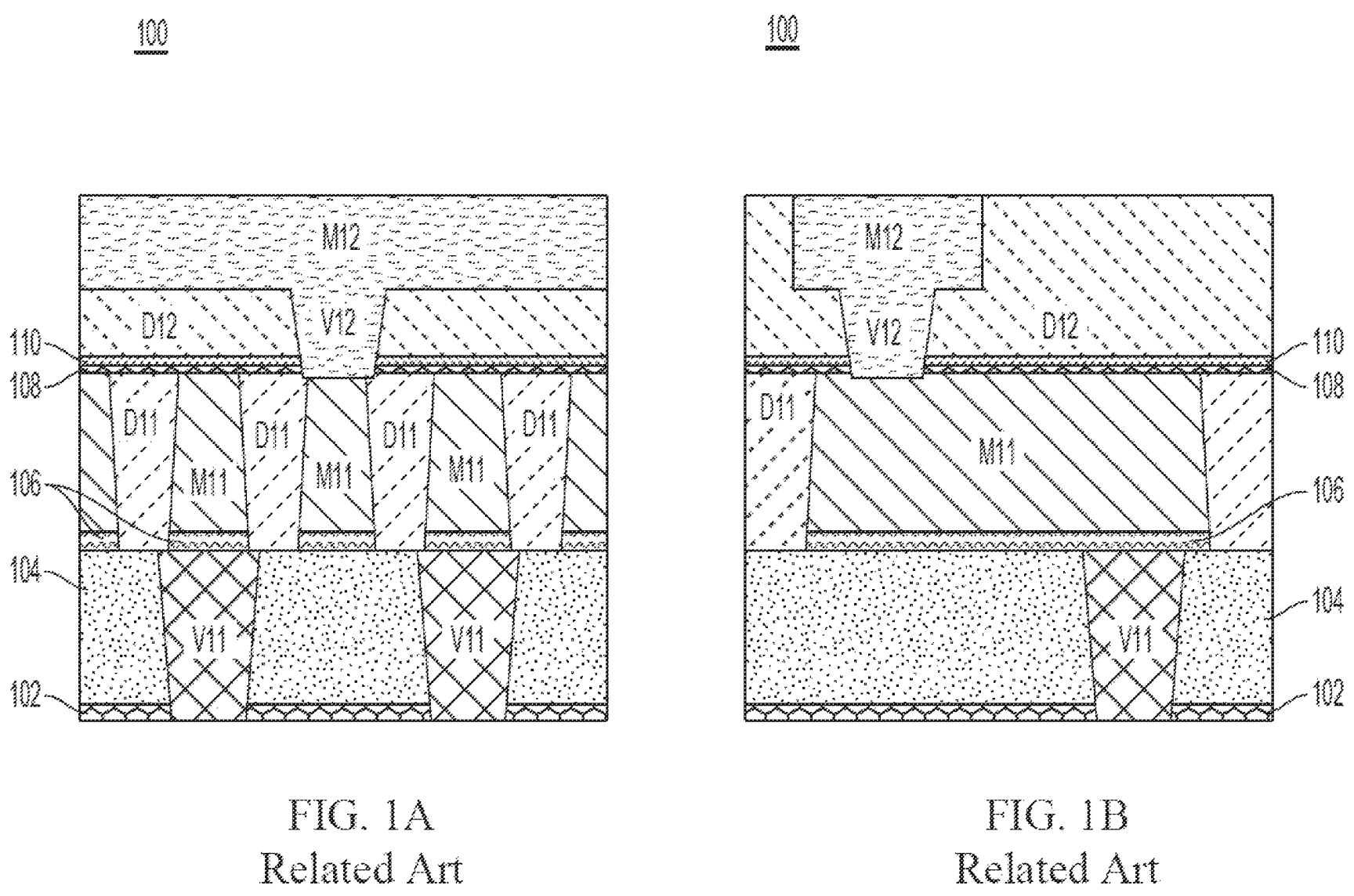

It is understood that, in the descriptions below and the accompanying drawings, an element, component, layer, pattern, structure or region indicated by same reference numbers or reference characters in various embodiments may refer to the same or different element, component, layer, pattern, structure or region. For example, a metal pattern M11 in FIGS. 1A and 1B, a metal pattern M11 in FIG. 2, and a metal pattern M31 in FIG. 3 may be the same one or different ones.

In the descriptions herein, the term "via" refers to or is interchangeably used with a via structure, via pattern or a via plug which is formed or filled in a via hole to connect two or more metal patterns formed at vertically stacked layers or levels. Also, the "metal pattern" refers to or is interchangeably used with a metal line or a metal structure.

Figure 3:
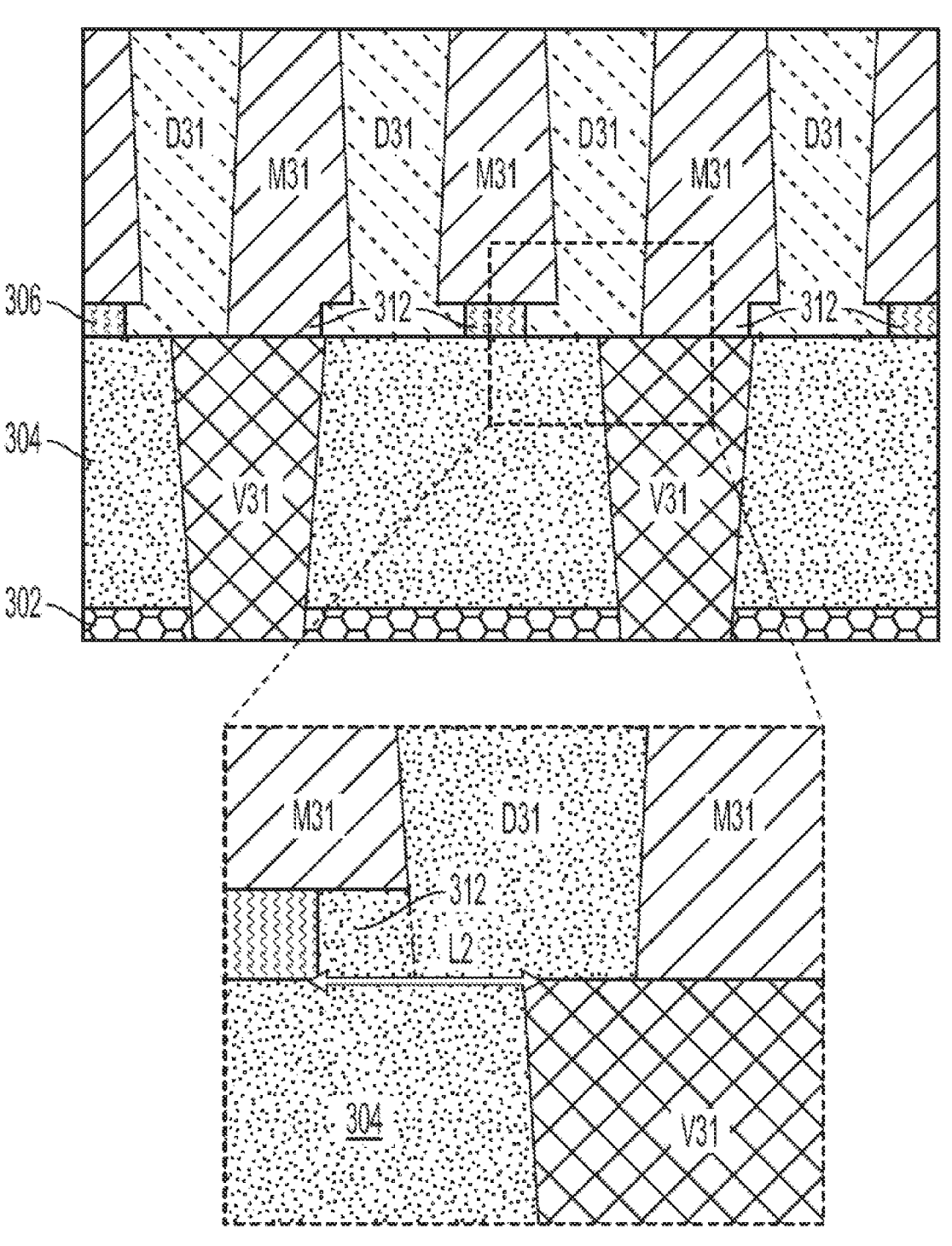
FIG. 3 illustrates a BEOL structure, according to an embodiment.

FIG. 3 is a diagram of a BEOL structure 300, according to an embodiment. The BEOL structure may include a base layer 302 (e.g., a bottom substrate), a dielectric layer 304, an adhesion layer 306, a plurality of vias V31 extending through the dielectric layer 304 and at least a portion of the base layer 302, a plurality of metal lines M31, and dielectric material D31 disposed between the plurality of metal lines M31. The plurality of metal lines M31 may include recesses 312 formed at a bottom surface of the respective metal lines, and formed due to removal of the adhesion layer 306 as is described later.

The plurality of metal lines M31 and the plurality of vias V31 may be formed of the same or different metals or metal compounds including at least one of copper (Cu), titanium (Ti), tantalum (Ta), aluminum (Al), tungsten (W), cobalt (Co), molybdenum (Mo), ruthenium (Ru), etc. In some embodiments, the plurality of vias V31 may be formed of Co, Ru, W, or Mo, and the plurality of metal lines M31 may be formed of Ru. The dielectric layer 304 may be formed of a silicon oxide or low K material, such as $SiO_2$, SiCOH, etc. The adhesion layer 306 may be formed of TiN, TaN, $TiO_2$, Ti, Ta, etc. The dielectric material D31 may be formed of a silicon oxide or low K material, such as SiCN.

In particular, the plurality of metal lines M31 may be patterned such that the metal lines M31 contact (e.g., ohmic contact) the vias V31 when positioned over the vias V31, and such that the metal lines M31 are substantially not in direct contact with the dielectric layer 304 when positioned over the dielectric layer 304. A metal line may be fully positioned over a via (i.e., the bottom surface of the metal line is within a width of the top surface of a via). When a metal line is not positioned over a via or is fully positioned over the dielectric layer 304 (i.e., the bottom surface of the metal line does not overlap with any via), the bottom surface of the metal line may be separated from directly contacting the dielectric layer 304 by a portion of adhesion layer 306. When a metal line is partially positioned over a via (i.e., a bottom surface of the metal line is over both the via and the dielectric layer 304), a first portion of the metal line may be in direct contact with a via, and a second portion may be positioned over the dielectric layer 304, and the second portion may be separated from directly contacting the dielectric layer 304 by the recess 312 formed through removal of the adhesion layer 306 originally positioned under the second portion of the metal line. That is, the recesses 312 may be provided at the metal/dielectric interface, and no adhesion layer may be provided at the metal/via interface.

Due to the positioning of the plurality of metal lines M31 directly contacting the plurality of vias V31, as well as the plurality of metal lines M31 being substantially not in direct contact with the dielectric layer 304, no oxygen layer is provided between the plurality of metal lines M31 and the plurality of vias V31 (i.e., an additional interface between the metal lines and the vias may be eliminated). Furthermore, the recesses 312 provide a larger distance L2 between the metal and the via than distance L1 as shown in FIG. 2. Thus, contact shorting may be reduced, and the via resistance may be improved. Further, due to the increased distance between the metal lines and the vias, metal misalignment to the vias may be decreased (i.e., there is a higher margin of error for metal misalignment).

Figure 4A:
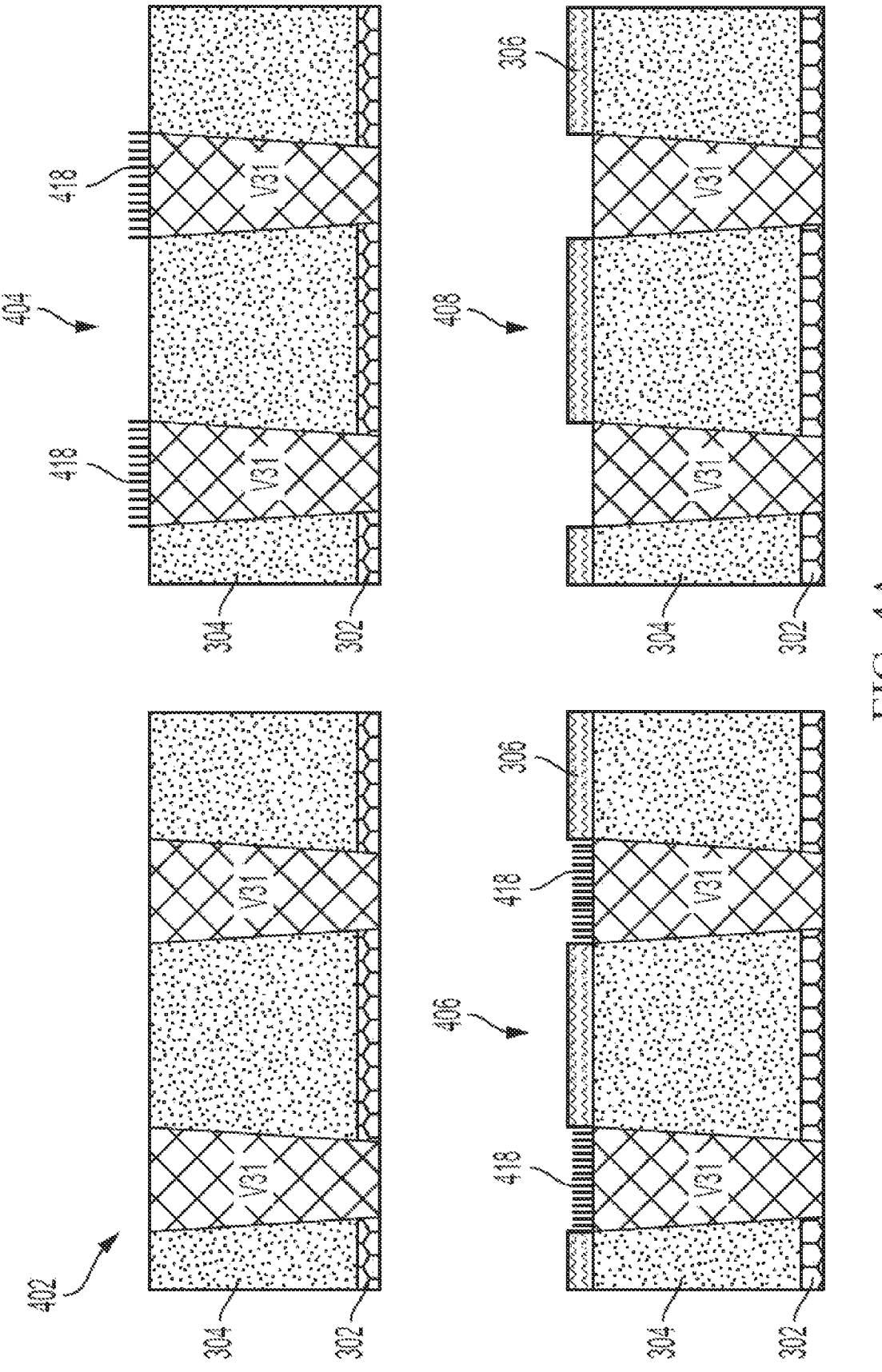
FIGS. 4A and 4B illustrate a process for forming the BEOL structure, according to an embodiment.
Figure 4B:
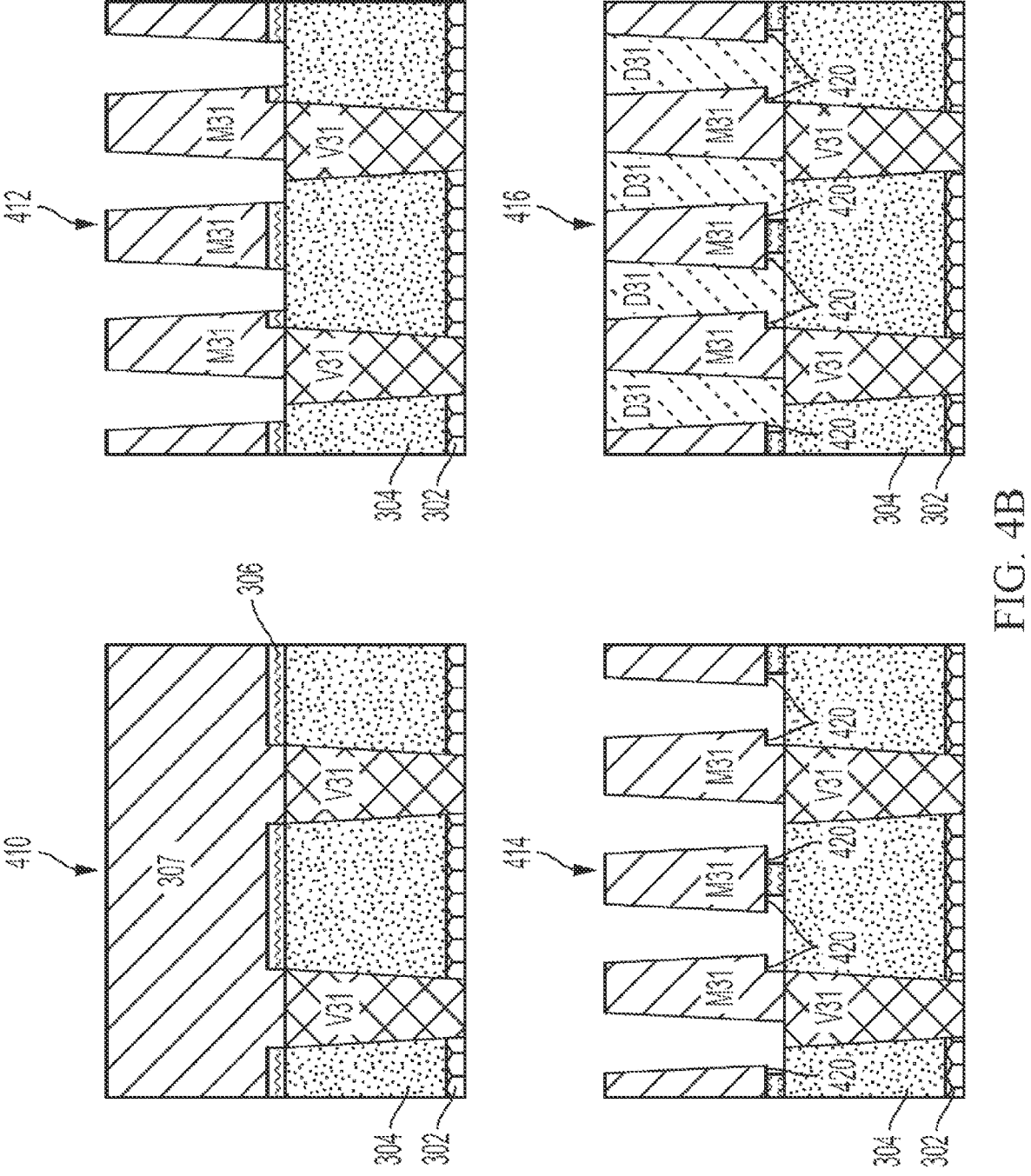
Figure 4C:
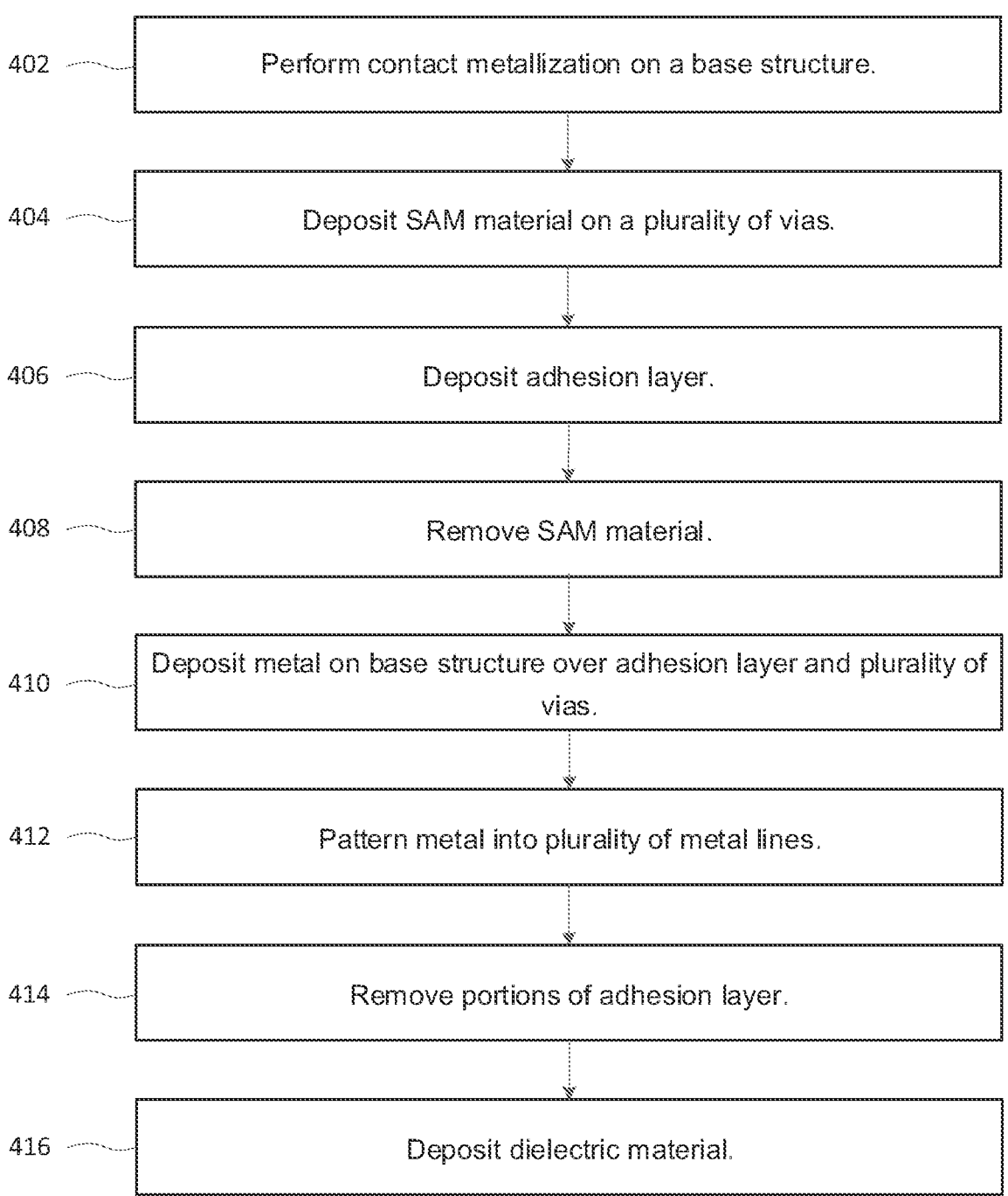
FIG. 4C is a flowchart of a process for forming the BEOL structure, according to an embodiment.

FIGS. 4A and 4B illustrate a process for forming the BEOL structure 300, according to an embodiment. FIG. 4C is a flowchart of a process for forming the BEOL structure 300, according to an embodiment.

In operation 402, contact metallization may be performed on a base structure. The base structure may include a base layer 302 and a dielectric layer 304, and a plurality of vias V31 may be formed in the dielectric layer 304. A chemical-mechanical polishing (CMP) may be performed on the base structure. In operation 404, self-assembled monolayer (SAM) material 418 may be deposited on the plurality of vias V31 for the selective deposition process. That is, the SAM material 418, which may be selectively deposited on metal, may be deposited on a top surface of the plurality of vias V31 In operation 406, an adhesion layer 306 may be deposited. The adhesion layer 306 may be deposited by an atomic layer deposition (ALD) process, a chemical vapor deposition (CVD) process, and/or other deposition processes that will be understood by one of ordinary skill in the art from the disclosure herein. The adhesion layer 306 may be positioned over a top surface of the dielectric layer 304 while not being positioned over the SAM material 418. That is, the adhesion layer 306 may be deposited such that the adhesion layer 306 is not positioned over the plurality of vias V31. For example, the adhesion layer 306 may be selectively deposited over areas that do not include the SAM material 418. In some embodiments, the adhesion layer 306 may be deposited over the base structure and the SAM material 418 such that the SAM material 418 may prevent the adhesion layer 306 from being deposited over the plurality of vias V31. In operation 408, the SAM material 418 may be removed. In embodiments where the adhesion layer 306 is deposited on the SAM material 418 as well as on the dielectric layer 304, the adhesion layer 306 that is positioned over the SAM material 418 may be removed with the SAM material 418 in operation 408. The SAM material 418 may be removed by a plasma treatment process. Once the SAM material 418 is removed, the adhesion layer 306 may be positioned on the top surface of the dielectric layer 306 while the top surfaces of the plurality of vias V31 may be exposed (i.e., the adhesion layer 306 is not positioned over the plurality of vias V31).

In operation 410, a metal 307 may be deposited on the base structure over the adhesion layer 306 and the plurality of vias V31. The metal 307 may directly contact the top surfaces of the plurality of vias V31. In some embodiments, the metal 307 may include a Ru-based material. In other embodiments, the metal 307 may include a W-based material, a Mo-based material, a Co-based material, and other materials as will be understood by one of ordinary skill in the art from the disclosure herein. In operation 412, the metal 307 may be patterned into a plurality of metal lines M31. The patterning operation may remove portions of the adhesion layer 306 that were positioned between the plurality of metal lines M31.

In operation 414, portions of the adhesion layer 306 may be removed, forming recesses 312 in metal lines that interface with the plurality of vias V31 and, for metal lines that do not interface with the plurality of vias V31, forming recesses 312 between the metal lines and the dielectric layer 304. The portions of the adhesion layer 306 may be removed by a wet recess process. The recesses 312 may be defined by an area or volume corresponding to an amount of the adhesion layer 306 that has been removed. The formation of the recesses 312 results in an increase in distance between the plurality of metal lines M31 and the plurality of vias V31, particularly a distance between a metal line that interfaces with the dielectric layer 304 and a metal line that interfaces with a via. In operation 416, a dielectric material D31 may be deposited to fill the spaces between the plurality of metal lines M31. The dielectric material D31 may be formed of a silicon oxide or low K material, such as SiCN.

Figure 5A:
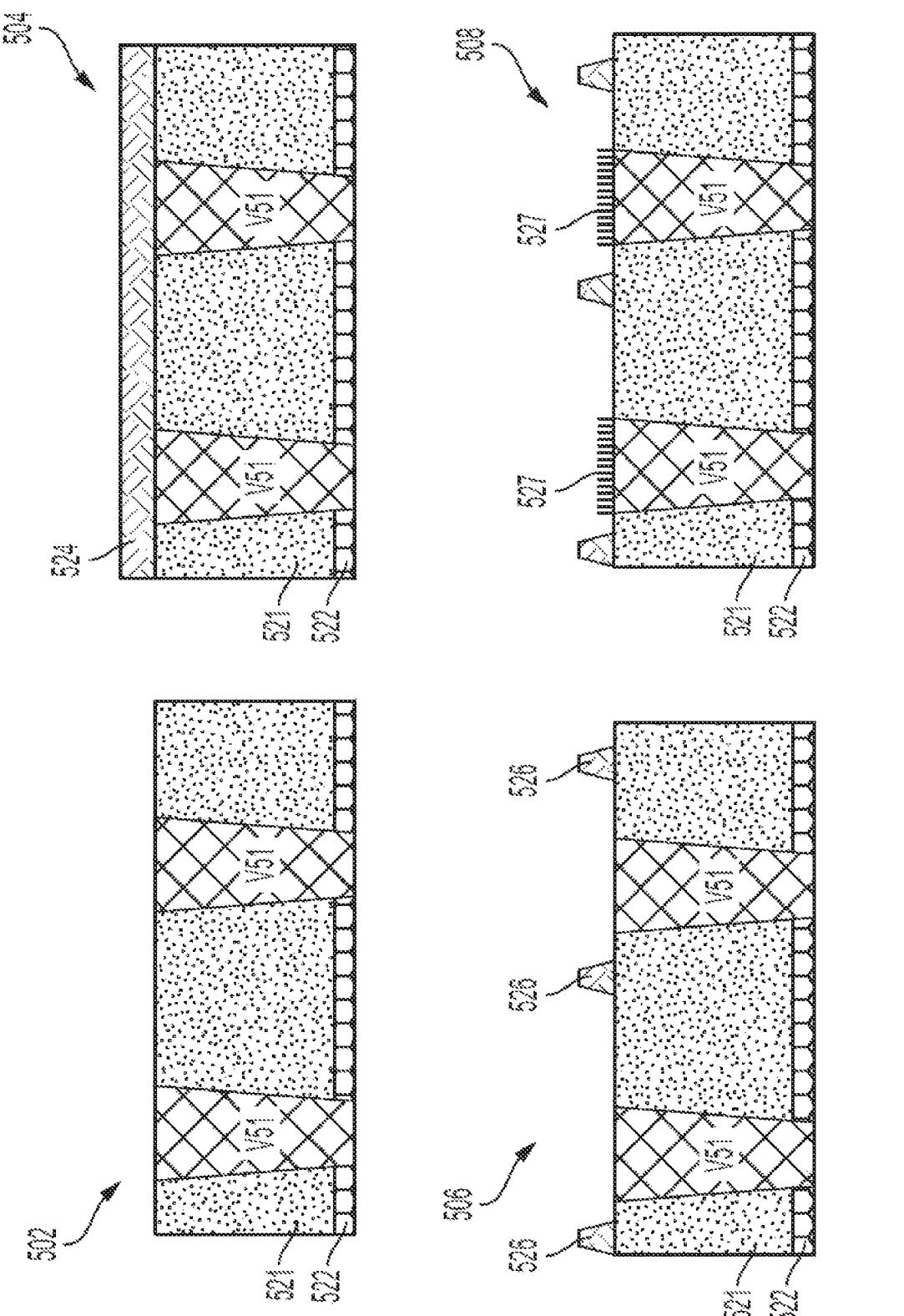
FIGS. 5A, 5B and 5C illustrate a process for forming a BEOL structure, according to an embodiment.
Figure 5B:
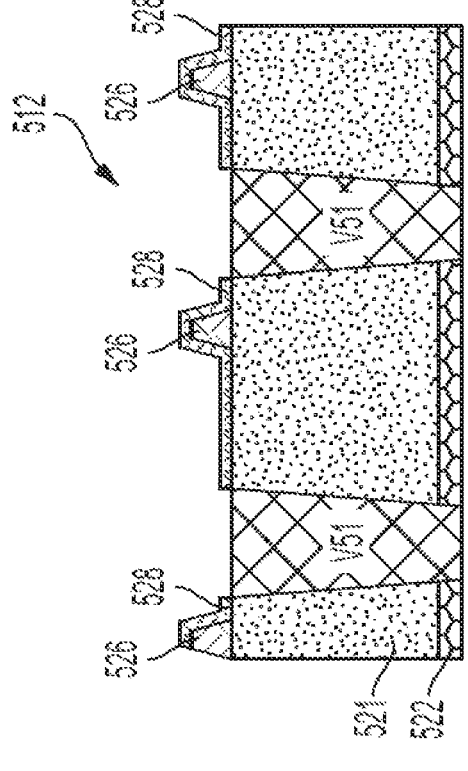
Figure 5B:
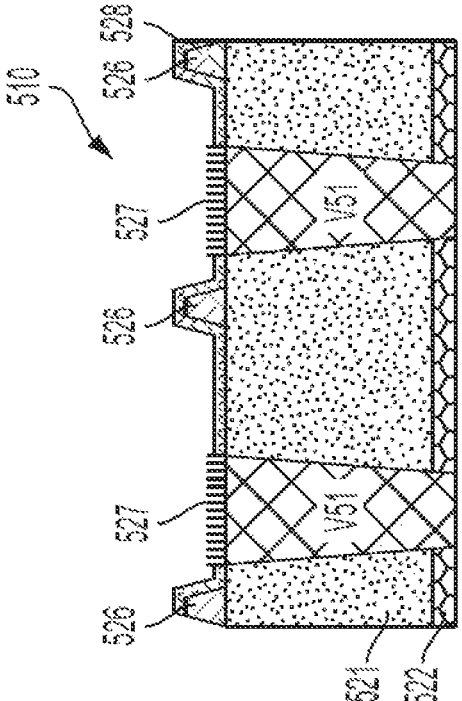
Figure 5C:
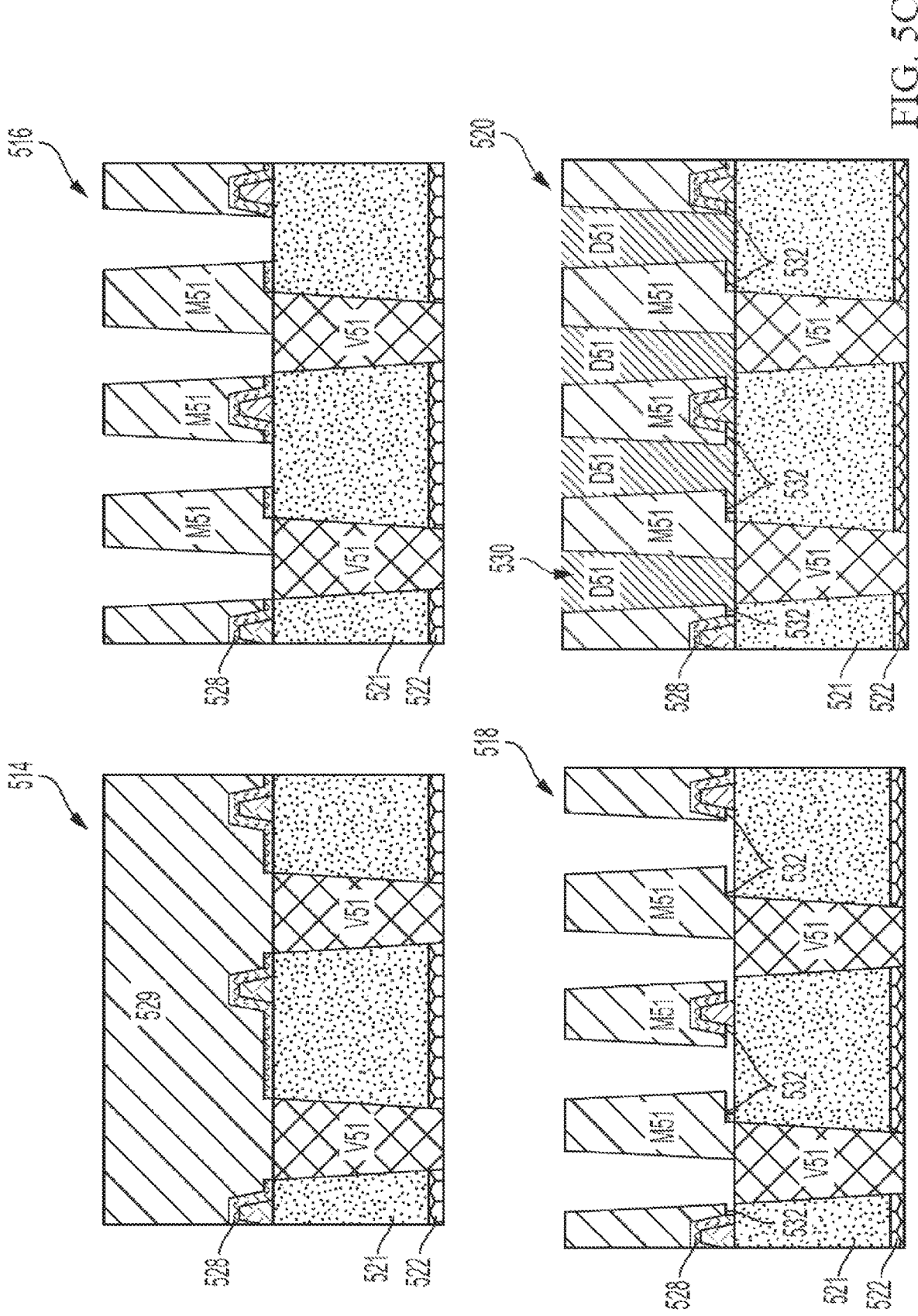
Figure 6A:
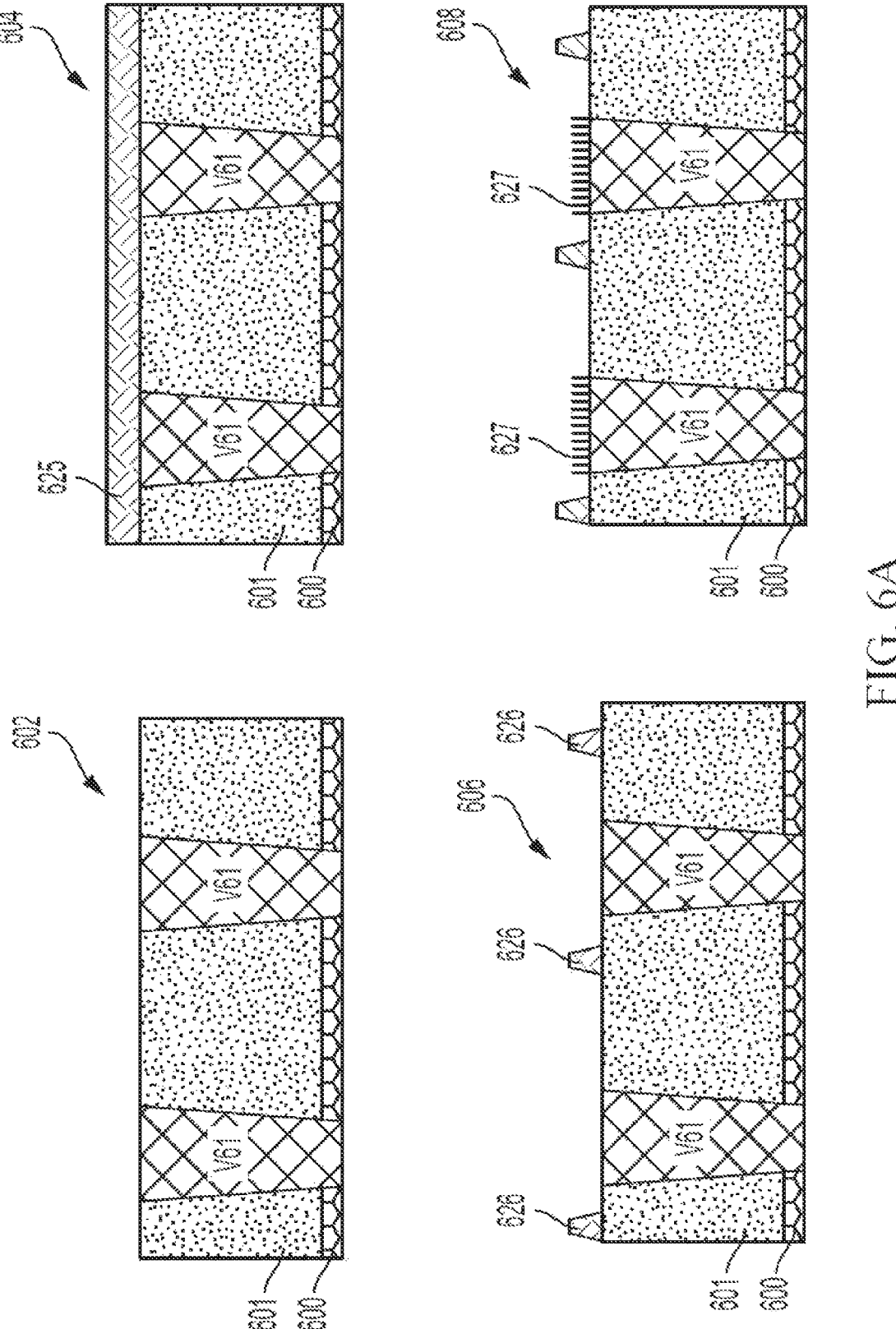
FIGS. 6A, 6B, 6C and 6D illustrate a process for forming a BEOL structure, according to an embodiment.
Figure 6B:
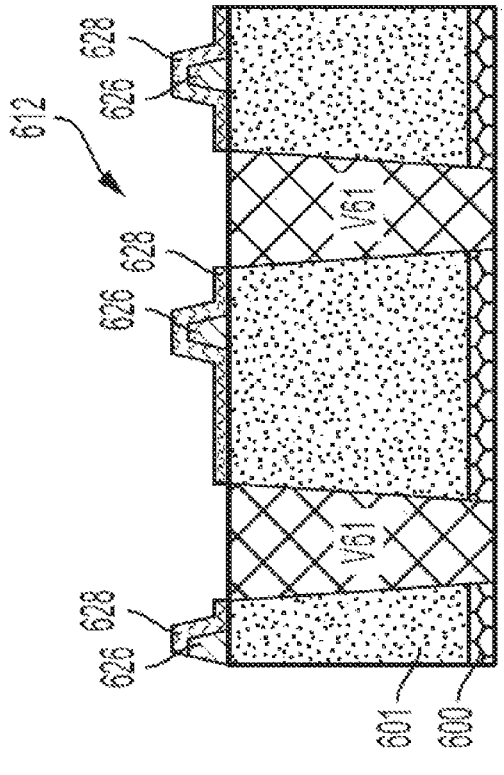
Figure 6B:
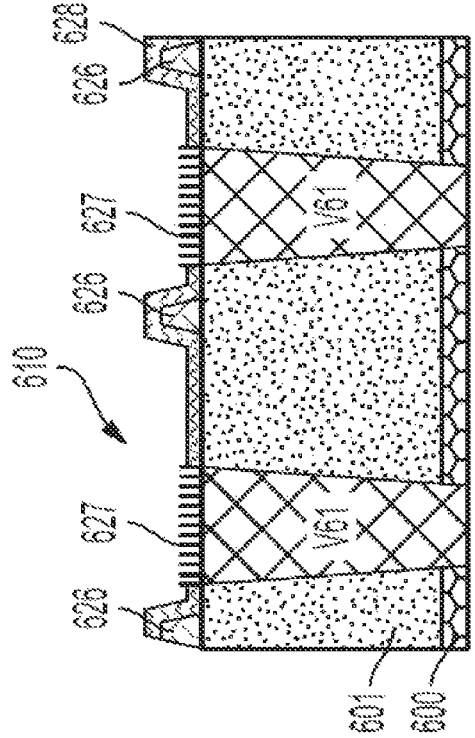
Figure 6C:
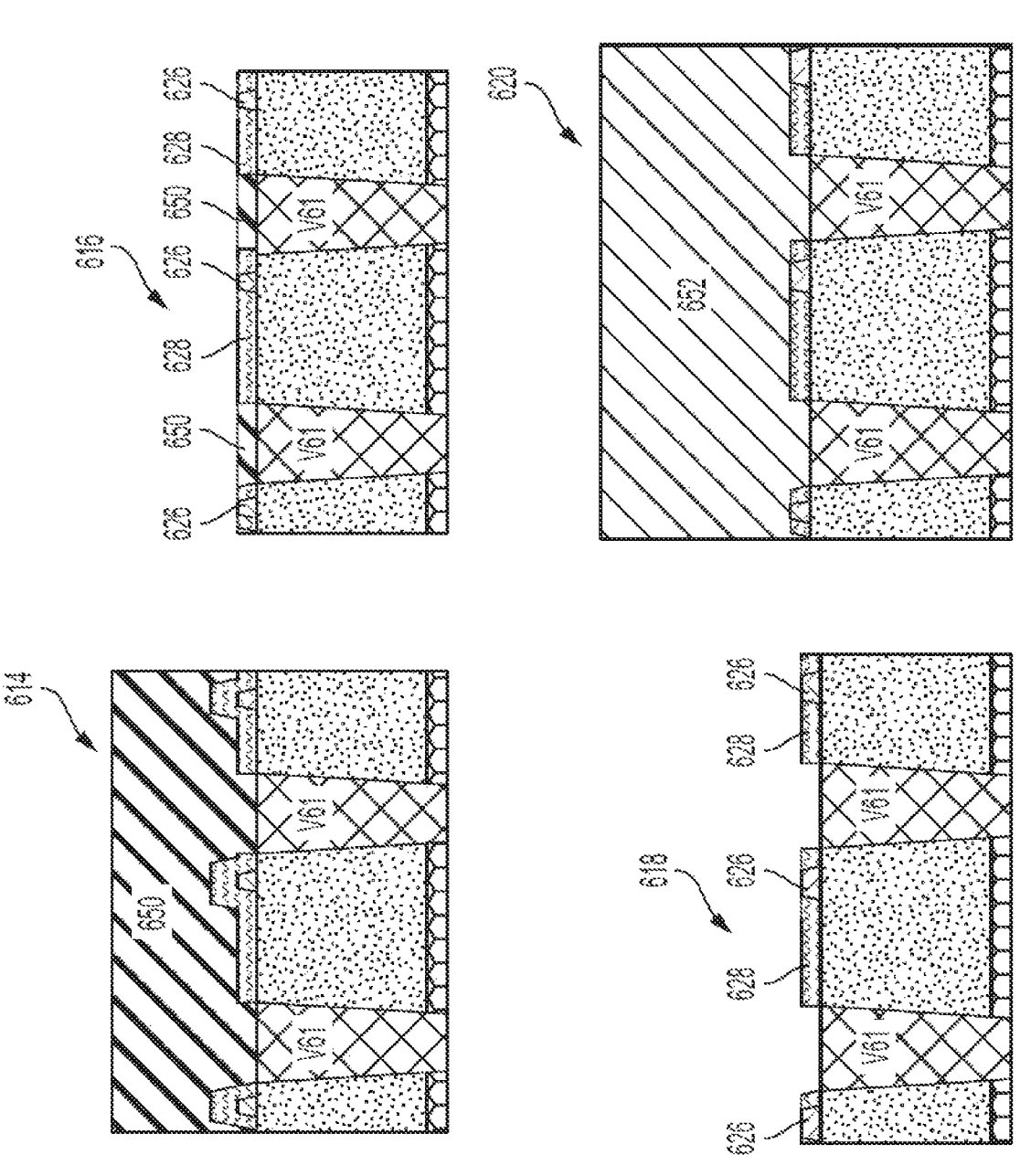
Figure 6D:
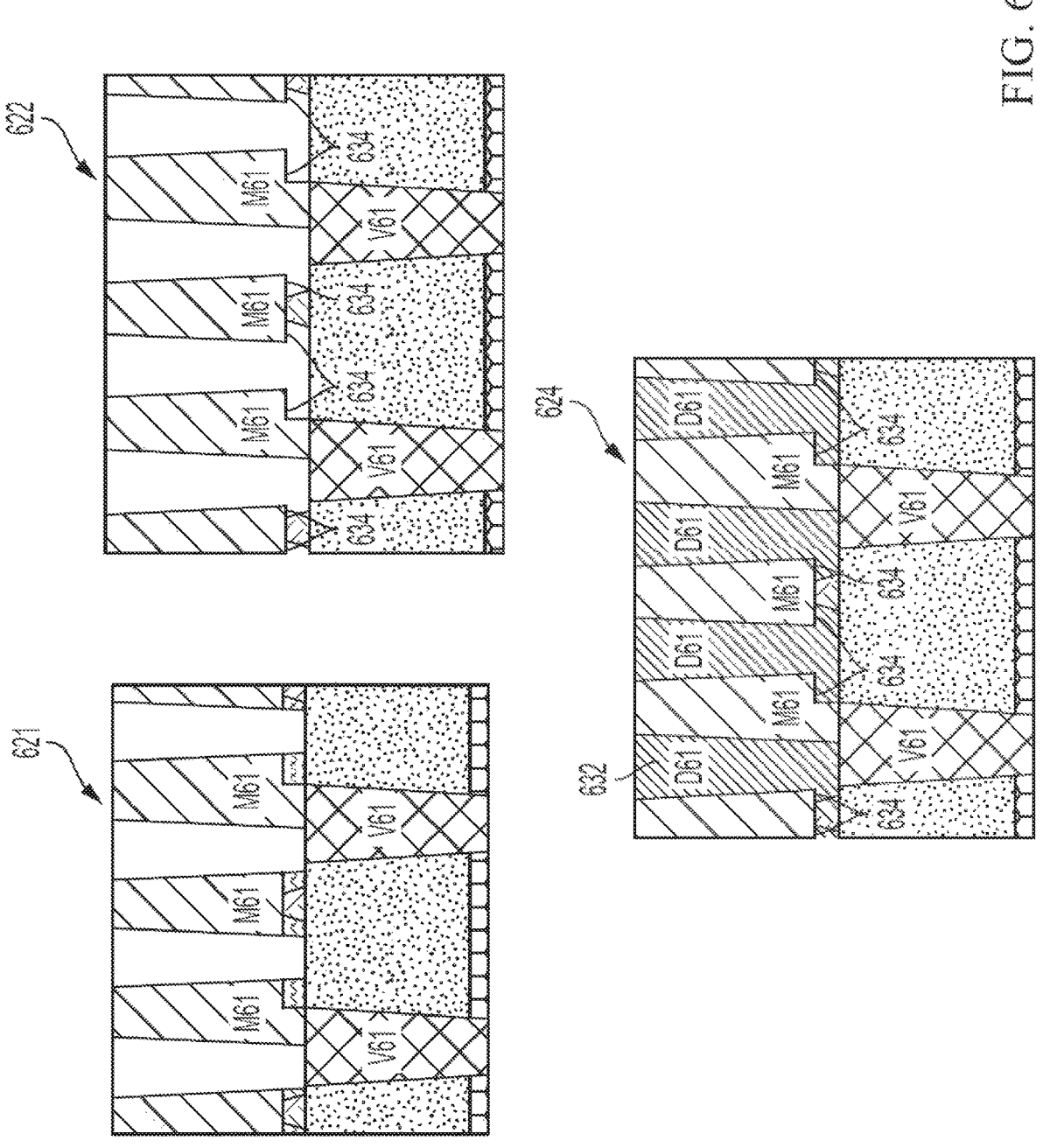

FIGS. 5A, 5B and 5C illustrate a process for forming a BEOL structure, according to an embodiment. FIG. 5D is a flowchart of a process for forming a BEOL structure of FIGS. 5A-5C, according to an embodiment.

The embodiments described in FIGS. 5A-5D further include an additional material that is not fully removed during the recess forming operation (i.e., the additional material remains intact during the recess forming operation that removes the adhesion layer In operation 502, contact metallization may be performed on a base structure. The base structure may include a base layer 522 and a dielectric layer 521, and a plurality of vias V51 may be formed in the dielectric layer 521. A CMP may be performed on the base structure. In operation 504, an oxide layer 524 may be deposited on the base structure. That is, the oxide layer 524 may be deposited over the top surfaces of the dielectric layer 521 and the plurality of vias V51. In operation 506, the oxide layer 524 may be patterned into a plurality of oxide patterns 526. The oxide layer 524 may be patterned such that the plurality of oxide patterns 526 are positioned on top surfaces of the dielectric layer 521 and not on top surfaces of the plurality of vias V51.

In operation 508, SAM material 527 may be deposited on the plurality of vias V51. That is, the SAM material 527 may be deposited on a top surface of the plurality of vias V51. In operation 510, an adhesion layer 528 may be deposited. The adhesion layer 528 may be deposited by an ALD process, a CVD process, and/or other deposition processes that will be understood by one of ordinary skill in the art from the disclosure herein. The adhesion layer 528 may be positioned over a top surface of the dielectric layer 521 while not being positioned over the SAM material 527. For example, the adhesion layer 528 may be selectively deposited over areas that do not include the SAM material 527. In some embodiments, the adhesion layer 528 may be deposited over the base structure and the SAM material 527 such that the SAM material 527 may prevent the adhesion layer 528 from being deposited over the plurality of vias V51. Furthermore, the adhesion layer 528 may be deposited to cover the oxide patterns 526.

In operation 512, the SAM material 527 may be removed. In embodiments where the adhesion layer 528 is deposited on the SAM material 527 as well as on the dielectric layer 521, the adhesion layer 528 that is positioned over the SAM material 527 may be removed with the SAM material 527 in operation 512. The SAM material 527 may be removed by a plasma treatment process. Once the SAM material 527 is removed, the adhesion layer 528 may be positioned on the top surface of the dielectric layer 521 while the top surfaces of the plurality of vias V51 may be exposed (i.e., the adhesion layer 528 is not positioned over the plurality of vias V51).

In operation 514, a metal 529 may be deposited on the base structure over the adhesion layer 528 and the plurality of vias V51. The metal 529 may directly contact the top surfaces of the plurality of vias V51. In some embodiments, the metal 529 may include a Ru-based material. In other embodiments, the metal 529 may include a W-based material, a Mo-based material, a Co-based material, and other materials as will be understood by one of ordinary skill in the art from the disclosure herein.

In operation 516, the metal 529 may be patterned into a plurality of metal lines M51. The patterning operation may remove portions of the adhesion layer 528 that were positioned between the plurality of metal lines M51. Furthermore, the metal 529 may be patterned such that the metal lines of the plurality of metal lines M51 that interface with the dielectric layer 521 include the oxide patterns 526 with the adhesion layer 528 deposited over the oxide patterns 526.

In operation 518, portions of the adhesion layer 528 may be removed, forming recesses 532 in metal lines that interface with the plurality of vias V51 and, for metal lines that do not interface with the plurality of vias V51, forming recesses 532 between the metal lines and the dielectric layer 521. The portions of the adhesion layer 528 may be removed by a TiN wet recess process. The recesses 532 may be defined by an area or volume corresponding to an amount of the adhesion layer 528 that has been removed. The formation of the recesses 532 results in an increase in distance between the plurality of metal lines M51 and the plurality of vias V51, particularly a distance between a metal line that interfaces with the dielectric layer 521 and a metal line that interfaces with a via. Furthermore, because the oxide patterns 526 are formed of a material that is not removed during the adhesion layer 528 removal process, the oxide patterns 526 remain in the metal lines that interface with the dielectric layer 521. The width of the oxide patterns 526 may be controlled to determine the size of the recesses 532 (i.e., the recess size may be controlled to extend through the bottom surface of the metal lines to a side of the oxide pattern). Thus, the risk of accidental removal of excessive portions of the adhesion layer 528 (or full removal of the adhesion layer 528) may be reduced.

In operation 520, a dielectric material D51 may be deposited to fill the spaces between the plurality of metal lines M51. The dielectric material D51 may be formed of a silicon oxide or low K material, such as SiCN.

FIGS. 6A, 6B, 6C and 6D illustrate a process for forming a BEOL structure, according to an embodiment. FIG. 6E is a flowchart of a process for forming a BEOL structure of FIGS. 6A-6D, according to an embodiment.

In operation 602, contact metallization may be performed on a base structure. The base structure may include a base layer 600 and a dielectric layer 601, and a plurality of vias V61 may be formed in the dielectric layer 601. A CMP may be performed on the base structure. In operation 604, an oxide layer 625 may be deposited on the base structure. That is, the oxide layer 625 may be deposited over the top surfaces of the dielectric layer 601 and the plurality of vias V61. In operation 606, the oxide layer 625 may be patterned into a plurality of oxide patterns 626. The oxide layer 625 may be patterned such that the plurality of oxide patterns 626 are positioned on top surfaces of the dielectric layer 601 and not on top surfaces of the plurality of vias V61.

In operation 608, SAM material 627 may be deposited on the plurality of vias V61. That is, the SAM material 627 may be deposited on a top surface of the plurality of vias V61. In operation 610, an adhesion layer 628 may be deposited. The adhesion layer 628 may be deposited by an ALD process, a CVD process, and/or other deposition processes that will be understood by one of ordinary skill in the art from the disclosure herein. The adhesion layer 628 may be positioned over a top surface of the dielectric layer 601 while not being positioned over the SAM material 627. For example, the adhesion layer 628 may be selectively deposited over areas that do not include the SAM material 627. In some embodiments, the adhesion layer 628 may be deposited over the base structure and the SAM material 627 such that the SAM material 627 may prevent the adhesion layer 628 from being deposited over the plurality of vias V31. Furthermore, the adhesion layer 628 may be deposited to cover the oxide patterns 626.

In operation 612, the SAM material 627 may be removed. In embodiments where the adhesion layer 628 is deposited on the SAM material 627 as well as on the dielectric layer 601, the adhesion layer 628 that is positioned over the SAM material 627 may be removed with the SAM material 627 in operation 612. The SAM material 627 may be removed by a plasma treatment process. Once the SAM material 627 is removed, the adhesion layer 628 may be positioned on the top surface of the dielectric layer 601 while the top surfaces of the plurality of vias V61 may be exposed (i.e., the adhesion layer 628 is not positioned over the plurality of vias V61).

In operation 614, an oxide material 650 may be deposited on the structure. That is, the oxide material 650 may be deposited over the adhesion layer 628 and top surfaces of the plurality of vias V61. In operation 616, the oxide material 650 may be selectively removed. The oxide material 650 may be selectively removed by a CMP process. The process to remove the oxide material 650 may also remove portions of the adhesion layer 628 as well as portions of the oxide patterns 626. Following the removal process, oxide material 650 may remain over top surfaces of the plurality of vias V61. In operation 618, the remaining oxide material 650 may be etched to remove the oxide material 650 from the top surfaces of the plurality of vias V61.

In operation 620, a metal 652 may be deposited on the base structure over the adhesion layer 628 and the plurality of vias V61. The metal 652 may directly contact the top surfaces of the plurality of vias V61. In some embodiments, the metal 652 may include a Ru-based material. In other embodiments, the metal 652 may include a W-based material, a Mo-based material, a Co-based material, and other materials as will be understood by one of ordinary skill in the art from the disclosure herein.

In operation 621, the metal 652 may be patterned into a plurality of metal lines M61. The patterning operation may remove portions of the adhesion layer 628 that were positioned between the plurality of metal lines M61. Furthermore, the metal 652 may be patterned such that the metal lines of the plurality of metal lines M61 that interface with the dielectric layer 601 include the oxide patterns 626 with the adhesion layer 628 deposited over the oxide patterns 626.

In operation 622, the adhesion layer 628 may be removed, forming recesses 634 in metal lines that interface with the plurality of vias V61 and, for metal lines that do not interface with the plurality of vias V61, forming recesses 634 between the metal lines and the dielectric layer 601. The adhesion layer 628 may be removed by a TiN wet recess process. The recesses 634 may be defined by an area or volume corresponding to an amount of the adhesion layer 628 that has been removed. The formation of the recesses 634 results in an increase in distance between the plurality of metal lines M61 and the plurality of vias V61, particularly a distance between a metal line that interfaces with the dielectric layer 601 and a metal line that interfaces with a via. Furthermore, because the oxide patterns 626 are formed of a material that is not removed during the adhesion layer 628 removal process, the oxide patterns 626 remain in the metal lines that interface with the dielectric layer 601. The width of the oxide patterns 626 may be controlled to determine the size of the recesses 634 (i.e., the recess size may be controlled to extend through the bottom surface of the metal lines to a side of the oxide pattern). Thus, the risk of accidental removal of excessive portions of the adhesion layer 628 (or full removal of the adhesion layer 628) may be reduced. Furthermore, as shown in operation 622, due to the oxide material 650 deposition and removal, the entire adhesion layer 628 may be removed, such that the metal lines that interface with the dielectric layer 601 are separated from contacting the dielectric layer 601 by the oxide pattern 626 within the metal line. Thus, the size of the oxide pattern 626 may be controlled to determine the size of the recesses 634, and the recesses 634 may be more reliably formed.

In operation 624, a dielectric material D61 may be deposited to fill the spaces between the plurality of metal lines M61. The dielectric material D61 may be formed of a silicon oxide or low K material, such as SiCN FIG. 7 is a schematic block diagram illustrating an electronic device including a semiconductor device in which the structure of at least one of the embodiments described in FIGS. 3, 4A-4C, 5A-5D, and 6A-6E, respectively, is used, according to an example embodiment.

Figure 7:
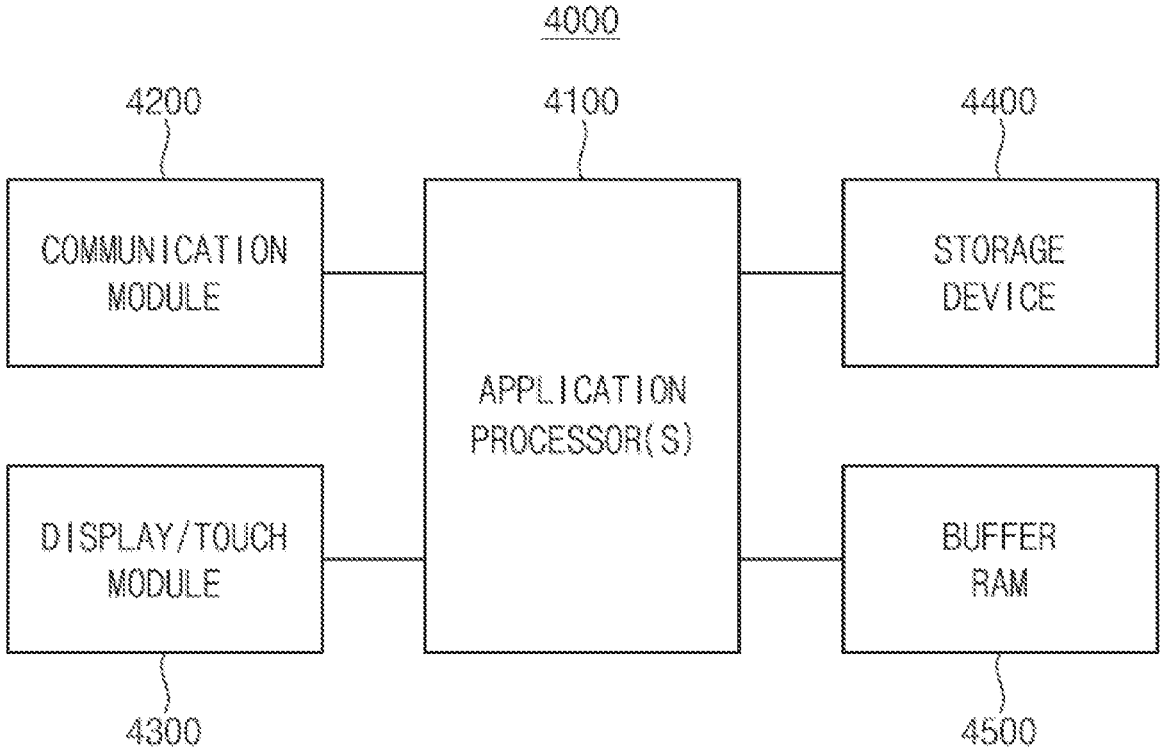
FIG. 7 is a schematic block diagram illustrating an electronic device including a semiconductor device in which the structure of at least one of the embodiments described in FIGS. 3, 4A-4C, 5A-5D, and 6A-6E, respectively, is used, according to an example embodiment.

Referring to FIG. 7, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 may be implemented to perform wireless or wire communications with an external device. The display/touch module 4300 may be implemented to display data processed by the application processor 4100 and/or to receive data through a touch panel. The storage device 4400 may be implemented to store user data. The storage device 4400 may be an embedded multimedia card (eMMC), a solid state drive (SSD), a universal flash storage (UFS) device, etc., not being limited thereto. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), ferroelectric RAM (FeRAM), etc.

At least one component in the electronic device 4000 may include at least one of the structures shown in FIGS. 3, 4A-4C, 5A-5D, and 6A-6E, respectively, according to embodiments.

The foregoing is illustrative of example embodiments and is not to be construed as limiting the disclosure. Although a number of example embodiments have been described, those skilled in the art will readily appreciate that many modifications are possible in the above embodiments without materially departing from the disclosure.

What is claimed is:

1. A semiconductor device, comprising:
a dielectric layer;
a plurality of vias in the dielectric layer, the plurality of vias comprising a first via;
an adhesion layer; and
a plurality of metal lines,
wherein a first metal line of the plurality of metal lines comprises a first recess at a bottom surface of the first metal line such that a first section of the first metal line directly contacts the first via and a second section of the first metal line defined by the first recess does not directly contact the first via or the dielectric layer having the first via therein,
wherein a second metal line of the plurality of metal lines comprises at least one second recess positioned between a bottom surface of the second metal line and the dielectric layer,
wherein the at least one second recess is defined by the bottom surface of the second metal line, a bottom surface of the adhesion layer, and a top surface of the dielectric layer, and
wherein the first metal line is free of overlap with the adhesion layer in a direction that is perpendicular to the top surface of the dielectric layer.

2. The semiconductor device of claim 1, wherein a first portion of the adhesion layer is positioned between the dielectric layer and the bottom surface of the second metal line such that the second metal line does not directly contact the dielectric layer.

3. The semiconductor device of claim 2, further comprising an oxide pattern positioned between the first portion of the adhesion layer and the dielectric layer.

4. The semiconductor device of claim 3, wherein the at least one second recess is defined by a side surface of the oxide pattern.

5. A semiconductor device, comprising:
a dielectric layer;
a plurality of vias in the dielectric layer, the plurality of vias comprising a first via;
a plurality of metal lines; and
at least one oxide pattern positioned between a bottom surface of a first metal line of the plurality of metal lines and a top surface of the dielectric layer,
wherein the first metal line comprises at least one first recess positioned between the bottom surface of the first metal line and the dielectric layer,
wherein a second metal line of the plurality of metal lines comprises a second recess at a bottom surface of the second metal line such that a first section of the second metal line directly contacts the first via and a second section of the second metal line defined by the second recess does not directly contact the first via or the dielectric layer having the first via therein,
wherein the at least one first recess is defined by the bottom surface of the first metal line, a side surface of the at least one oxide pattern, and the top surface of the dielectric layer, and
wherein the second metal line is free of overlap with the at least one oxide pattern in a direction that is perpendicular to the top surface of the dielectric layer.

6. The semiconductor device of claim 5, wherein the plurality of metal lines comprise a ruthenium-based material.

7. A method of fabricating a semiconductor device, comprising:
providing a base structure comprising a dielectric layer and a plurality of vias formed in the dielectric layer;
depositing an adhesion layer on a top surface of the dielectric layer;
patterning a plurality of metal lines on the base structure; and
forming at least one first recess at a bottom surface of a first metal line of the plurality of metal lines such that a first section of the first metal line directly contacts a first via of the plurality of vias and a second section of the first metal line defined by the at least one first recess does not directly contact the first via or the dielectric layer in which the first via is formed and/or between a bottom surface of a second metal line of the plurality of metal lines and the dielectric layer,
wherein the at least one first recess between the bottom surface of the second metal line and the dielectric layer is defined by the bottom surface of the second metal line, a bottom surface of the adhesion layer, and a top surface of the dielectric layer, and
wherein the first metal line is free of overlap with the adhesion layer in a direction that is perpendicular to the top surface of the dielectric layer.

8. The method of claim 7, wherein forming the at least one first recess comprises removing a portion of the adhesion layer positioned at the bottom surface of the first metal line, such that the at least one first recess is defined by a volume of the portion of the adhesion layer that is removed.

9. The method of claim 8, wherein the portion of the adhesion layer is removed by a titanium nitride wet recess process.

10. The method of claim 7, further comprising patterning an oxide material layer on the base structure prior to depositing the adhesion layer.

11. The method of claim 10, wherein the plurality of metal lines are patterned over the oxide material layer such that the oxide material layer is positioned between the bottom surface of the second metal line of the plurality of metal lines that does not interface with the plurality of vias-and the top surface of the dielectric layer in which the plurality of vias are formed.

12. The method of claim 11, wherein forming the at least one first recess comprises removing a portion of the adhesion layer at the bottom surface of the second metal line that does not interface with the plurality of vias, such that the at least one first recess is defined by the bottom surface of the second metal line that does not interface with the plurality of vias, a side surface of the oxide material layer, and the top surface of the dielectric layer.

13. The method of claim 12, wherein the at least one first recess is further defined by the bottom surface of the adhesion layer at the bottom surface of the second metal line that does not interface with the plurality of vias.

14. The method of claim 7, wherein the plurality of metal lines comprise a ruthenium-based material.

15. The method of claim 7, further comprising depositing a dielectric material between the patterned plurality of metal lines such that the dielectric material fills the at least one first recess.

16. The method of claim 7, further comprising, prior to depositing the adhesion layer, depositing a self-assembled monolayer (SAM) material on top surfaces of the plurality of vias such that, when the adhesion layer is deposited, the adhesion layer does not contact the plurality of vias.

17. The method of claim 16, wherein the adhesion layer is deposited over the SAM material, and wherein the method further comprises removing the SAM material and portions of the adhesion layer deposited over the SAM material by a plasma treatment process.

\*   \*   \*   \*   \*